(12) United States Patent
Kim et al.

(10) Patent No.: US 12,454,620 B2
(45) Date of Patent: Oct. 28, 2025

(54) COMPOSITION FOR ENCAPSULATION

(71) Applicant: LG CHEM, LTD., Seoul (KR)

(72) Inventors: So Young Kim, Daejeon (KR); Seung Min Lee, Daejeon (KR); Eun Gu Han, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 902 days.

(21) Appl. No.: 17/611,397

(22) PCT Filed: Jun. 5, 2020

(86) PCT No.: PCT/KR2020/007348
§ 371 (c)(1),
(2) Date: Nov. 15, 2021

(87) PCT Pub. No.: WO2020/246847
PCT Pub. Date: Dec. 10, 2020

(65) Prior Publication Data
US 2022/0195203 A1 Jun. 23, 2022

(30) Foreign Application Priority Data
Jun. 5, 2019 (KR) .................... 10-2019-0066714

(51) Int. Cl.
*B32B 3/10* (2006.01)
*C08J 7/04* (2020.01)
(Continued)

(52) U.S. Cl.
CPC .............. *C09D 4/06* (2013.01); *C08J 7/0427* (2020.01); *C08L 23/22* (2013.01); *C09D 4/00* (2013.01);
(Continued)

(58) Field of Classification Search
None
See application file for complete search history.

(56) References Cited

U.S. PATENT DOCUMENTS

| 2018/0051193 A1* | 2/2018 | Shim ................. C09J 133/00 |
| 2018/0072925 A1 | 3/2018 | Kim et al. |

FOREIGN PATENT DOCUMENTS

| CN | 104584257 A | 4/2015 |
| CN | 106029817 A | 10/2016 |

(Continued)

OTHER PUBLICATIONS https://www.sigmaaldrich.com/US/en/search/9003-29-6?focus=products&page=1&perpage=30&sort=relevance&term=9003-29-6&type=cas_number (Year: 2025).*

(Continued)

*Primary Examiner* — Christopher M Polley
(74) *Attorney, Agent, or Firm* — Bryan Cave Leighton Paisner LLP

(57) ABSTRACT

The present disclosure relates to a composition for encapsulating an organic electronic element and an organic electronic device comprising the same, and provides an encapsulation composition which can form an encapsulation structure capable of effectively blocking moisture or oxygen introduced from the outside into the organic electronic device, thereby securing the lifespan of the organic electronic device and implementing endurance reliability of the encapsulation structure at high temperature and high humidity, and has high shape retainability, and an organic electronic device comprising the same.

19 Claims, 1 Drawing Sheet

(51) Int. Cl.
*C08L 23/22* (2006.01)
*C09D 4/00* (2006.01)
*C09D 4/06* (2006.01)
*C09D 123/22* (2006.01)
*H10K 50/84* (2023.01)
*H10K 50/842* (2023.01)
*H10K 85/10* (2023.01)
*C08K 3/22* (2006.01)
*H10K 50/844* (2023.01)

(52) U.S. Cl.
CPC ....... *C09D 123/22* (2013.01); *H10K 50/8426* (2023.02); *H10K 50/846* (2023.02); *H10K 85/141* (2023.02); *H10K 85/151* (2023.02); *C08K 2003/2206* (2013.01); *H10K 50/844* (2023.02)

(56) References Cited

FOREIGN PATENT DOCUMENTS

| | | | |
|---|---|---|---|
| CN | 106030844 A | 10/2016 | |
| CN | 107275511 A | 10/2017 | |
| CN | 107580619 A | 1/2018 | |
| CN | 107636072 A | 1/2018 | |
| CN | 107922558 A | 4/2018 | |
| JP | 08-12723 A | 1/1996 | |
| JP | H08-12723 A | * | 8/1996 |
| JP | 2005154528 A | 6/2005 | |
| JP | 2008-024882 A | 2/2008 | |
| JP | 2010180324 A | 8/2010 | |
| JP | 2014-148648 A | 8/2014 | |
| JP | 2015-162415 A | 9/2015 | |
| JP | 2016135860 A | 7/2016 | |
| JP | 2018-513890 A | 5/2018 | |
| JP | 1996-012723 A | 1/2019 | |
| JP | 2019-058640 A | 4/2019 | |
| KR | 10-2016-0114543 A | 10/2016 | |
| KR | 10-1959466 B1 | 3/2019 | |
| WO | 2018/232065 A1 | 12/2018 | |

OTHER PUBLICATIONS

/https://www.toagosei.co.jp/products/polymer/resin/item/aronix31.pdf (Year: 2025).*

Machine translation of JP H08-12723 (Year: 1996).*

* cited by examiner

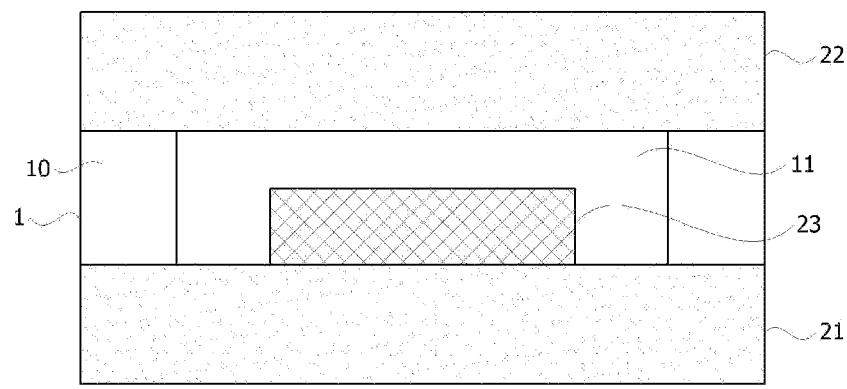

COMPOSITION FOR ENCAPSULATION

CROSS-REFERENCE TO RELATED APPLICATIONS

This application is a National Phase entry pursuant to 35 U.S.C. § 371 of International Application No. PCT/KR2020/007348, filed Jun. 5, 2020, and claims the benefit of and priority to Korean Patent Application No. 10-2019-0066714 filed on Jun. 5, 2019, the disclosures of which are hereby incorporated by reference in their entirety for all purposes as if fully set forth herein.

TECHNICAL FIELD

The present application relates to a composition for encapsulating an organic electronic element, an organic electronic device comprising the same, and a method for manufacturing the organic electronic device.

BACKGROUND ART

An organic electronic device (OED) means a device comprising an organic material layer that generates alternate current of charges using holes and electrons, and an example thereof can include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the most important problem is a durability problem. Organic materials and metal electrodes, and the like contained in the OLED are very easily oxidized by external factors such as moisture. Thus, products containing OLEDs are highly sensitive to environmental factors. Accordingly, various methods have been proposed in order to effectively block infiltration of oxygen or moisture from the outside to the organic electronic device such as the OLED.

DISCLOSURE

Technical Problem

The present application provides a composition for encapsulation which can form an encapsulation structure capable of effectively blocking moisture or oxygen introduced from the outside into the organic electronic device, thereby securing the lifespan of the organic electronic device and implementing endurance reliability of the encapsulation structure at high temperature and high humidity, and has high shape retainability, and an organic electronic device comprising the same.

Technical Solution

The present application relates to an encapsulation composition. The encapsulation composition can be an encapsulating material applied to sealing or encapsulating an organic electronic device such as, for example, an OLED. In one example, the encapsulation composition of the present application can be applied to sealing or encapsulating at least one side of an organic electronic element to form an encapsulation structure. Thus, after the encapsulation composition is applied to the encapsulation, it can be present at the periphery of the organic electronic device.

In this specification, the term "organic electronic device" means an article or device having a structure comprising an organic material layer that generates alternate current of charges using holes and electrons between a pair of electrodes facing each other, and an example thereof can include, but is not limited to, a photovoltaic device, a rectifier, a transmitter and an organic light emitting diode (OLED), and the like. In one example of the present invention, the organic electronic device can be an OLED.

An exemplary encapsulation composition for encapsulating an organic electronic element can comprise a non-reactive olefin-based compound and a reactive olefin-based compound. In the encapsulation composition formulation of the non-reactive olefin-based compound and the reactive olefin-based compound, the present application can implement the shape retainability and the moisture- and heat-resistant durability under severe conditions while implementing moisture barrier performance.

In one example, the present application comprises a moisture adsorbent, which is described below, in the composition for encapsulation, where the moisture adsorbent means a chemically reactive adsorbent capable of removing moisture or oxygen through a chemical reaction with the moisture or oxygen penetrated into the encapsulation structure. Generally, when a moisture adsorbent reacts with moisture in an encapsulation structure, the volume expands as it reacts with moisture, resulting in stress. Besides, the encapsulation structure of the present application contains a large amount of the moisture adsorbent in the periphery of the substrate on which the organic electronic element is formed, as described below, and thus when it does not have sufficient elasticity to relieve the expansion stress due to moisture adsorption, the encapsulation structure may peel off from the adherend or the encapsulation structure may be destroyed. In the specific composition formulation of the encapsulation composition, the present application implements the shape retainability of the encapsulation structure and the durability at high temperature and high humidity under severe conditions while implementing a suitable degree of crosslinking to satisfy moisture blocking performance.

In a specific example of the present application, the non-reactive olefin-based compound of the encapsulation composition may not include a separate curable functional group at both ends of the compound. That is, in this specification, the term "non-reactive compound" means a compound having no curable functional group at both ends of the compound or a compound having no reactivity with a curable monomer to be described below. However, the non-reactive olefin-based compound defined in this specification can have, for example, a double bond in the main chain, where the double bond can also participate in the reaction, but excludes only the case having a curable functional group at the end. In one example, the non-reactive olefin-based compound can be a hydrophobic resin, and can have a water vapor transmission rate of 50 g/m$^2$·day or less. Considering that the encapsulation composition of the present application is applied to seal or encapsulate an organic electronic device, it can provide an excellent moisture barrier property by comprising the non-reactive olefin-based compound satisfying the above water vapor transmission rate range. In this specification, the "resin having a water vapor transmission rate of 50 g/m$^2$·day or less" can mean a resin that in a state where the resin is prepared in the form of a film formed of a resin layer having any one of 5 to 100 µm, the water vapor transmission rate measured in the thickness direction of the film is 50 g/m²·day or less. The water vapor transmission rate is measured under 100° F. and 100% relative humidity, which can be 50 g/m²·day or less, 40 g/m²·day or less, 30 g/m²·day or less, 20 g/m²·day or less, or 10 g/m²·day or less. The lower the water vapor transmission rate is, the better the moisture barrier property can be exhibited, and thus the lower limit is not particularly limited, but can be, for example, 0 g/m²·day or 0.1 g/m²·day.

Specifically, an exemplary non-reactive olefin-based compound of the present application comprises a non-reactive olefin-based compound derived from a mixture of monomers, where the mixture can have at least an isoolefin monomer component having 4 to 7 carbon atoms or a multi-olefin monomer component. The isoolefin can be present, for example, in a range of 70 to 100 wt %, or 85 to 99.5 wt %, based on the total monomer weight. The multi-olefin-derived component can be present in a range of 0.5 to 30 wt %, 0.5 to 15 wt %, or 0.5 to 8 wt %.

The isoolefin can be exemplified by, for example, isobutylene, 2-methyl-1-butene, 3-methyl-1-butene, 2-methyl-2-butene, 1-butene, 2-butene, methyl vinyl ether, indene, vinyltrimethylsilane, hexene, or 4-methyl-1-pentene. The multi-olefin can have 4 to 14 carbon atoms and can be exemplified by, for example, isoprene, butadiene, 2,3-dimethyl-1,3-butadiene, myrcene, 6,6-dimethyl-fulvene, hexadiene, cyclopentadiene, or piperylene. Other polymerizable monomers, such as styrene and dichlorostyrene, can also be homopolymerized or copolymerized.

In the present application, the non-reactive olefin-based compound can comprise an isobutylene-based homopolymer or copolymer. As mentioned above, the isobutylene-based non-reactive olefin-based compound or polymer can mean an olefin-based resin or polymer containing 70 mol % or more of repeating units from isobutylene and one or more other polymerizable units.

In the present application, the non-reactive olefin-based compound can be a butyl rubber or a branched butyl rubber. An exemplary non-reactive olefin-based compound is an unsaturated butyl rubber, such as a copolymer of olefin or isoolefin and multi-olefin. As the non-reactive olefin-based compound contained in the encapsulation composition of the present invention, poly(isobutylene-co-isoprene), polyisoprene, polybutadiene, polyisobutylene, poly(styrene-co-butadiene), natural rubber, butyl rubber, and a mixture thereof can be exemplified. The non-reactive olefin-based compound useful in the present application can be prepared by any suitable means known in the art, and the present invention is not limited by this method of preparing a non-reactive olefin-based compound.

In one example, the non-reactive olefin-based compound can be a polymer resin. For example, the non-reactive olefin-based compound can have a weight average molecular weight of 100,000 g/mol or less, less than 100,000 g/mol, 90,000 g/mol or less, 70,000 g/mol or less, 50,000 g/mol or less, less than 30,000 g/mol, 10,000 g/mol or less, 8000 g/mol or less, 5000 g/mol or less, or 3000 g/mol or less. In addition, the lower limit of the weight average molecular weight can be 500 g/mol or more, 800 g/mol or more, or 1000 g/mol or more. By controlling the weight average molecular weight of the non-reactive olefin-based compound in the above range, the present application can implement an encapsulation composition suitable for application and encapsulation processes. The encapsulation composition can have a liquid phase shape and can be suitably applied to side encapsulation application of an organic electronic device to be described below.

In addition, the non-reactive olefin-based compound of the present application can be included in a range of 40 to 90 wt %, 42 to 80 wt %, 45 to 70 wt %, 50 to 60 wt %, or 53 to 58 wt % in the total composition. The total composition is based on the organic material in the encapsulation composition. The present application can implement a desired degree of moisture barrier property and elasticity after curing by adjusting the content ratio of the non-reactive olefin-based compound.

In one example, the encapsulation composition of the present application can comprise a reactive olefin-based compound. The reactive olefin-based compound can have one or more reactive functional groups at the end. The compound can have one or more reactive functional groups, or multi-functionality of 2 to 10 reactive functional groups. The present application makes it possible to maintain the elasticity of the encapsulation structure while complementing the low heat durability at high temperature and high humidity of the conventional non-reactive olefin-based compound by comprising the reactive olefin-based compound.

The reactive olefin-based compound can have a weight average molecular weight in a range of 1,000 to 50,000 g/mol, 5000 to 40,000 g/mol, 6000 to 35,000 g/mol, 7000 to 30,000 g/mol, 8000 to 25,000 g/mol, 9000 to 23,000 g/mol or 9,500 to 20,000 g/mol. The present application can implement the desired physical properties as the side encapsulating material by comprising the oligomer having the weight average molecular weight range. In this specification, the weight average molecular weight means a value converted to standard polystyrene measured by GPC (gel permeation chromatograph).

In one example, the reactive olefin-based compound can comprise at least one or more or two or more reactive functional groups, where the reactive functional group can be an active energy ray-curable functional group. The active energy ray-curable functional group can comprise a curable functional group by electromagnetic wave irradiation such as a vinyl group, an acryloyl group, a methacryloyl group, a urethane group, an epoxide group, a cyclic ether group, a sulfide group, an acetal group or a lactone group. In one specific example, the curable functional group can comprise a radical curable functional group. In a specific example of the present application, the reactive olefin-based compound can comprise an isobutylene monomer as a polymerization unit, but is not limited thereto. In addition, the reactive olefin-based compound can have a cyclic structure having 3 to 12 carbon atoms in its molecular structure. The cyclic structure can be alicyclic or aromatic. The reactive olefin-based compound can be included in the range of less than 50 wt %, 10 to 48 wt %, 15 to 45 wt %, 18 to 40 wt %, or 20 to 38 wt % in the total composition. In addition, when the non-reactive olefin-based compound has been set to 100 parts by weight, the reactive olefin-based compound can be included in the range of 10 to 150 parts by weight, 15 to 120 parts by weight, 18 to 100 parts by weight, 20 to 95 parts by weight, 25 to 90 parts by weight, 28 to 88 parts by weight, 30 to 80 parts by weight, 35 to 70 parts by weight, 40 to 68 parts by weight, or 50 to 65 parts by weight. Alternatively, without being limited thereto, when the non-reactive olefin-based compound has been set to 100 parts by weight, the reactive olefin-based compound can be included in an amount of 10 to 45 parts by weight or 20 to 40 parts by weight. As the encapsulation composition of the present application comprises the reactive olefin-based compound, it can improve moisture barrier properties by maintaining hydrophobicity throughout the composition, and accommodate a large amount of moisture adsorbent by having elasticity after curing, and accordingly, the encapsulation composition having excellent moisture barrier properties is provided.

In a specific example of the present application, the encapsulation composition can further comprise a curable monomer. The curable monomer can have a weight average molecular weight of less than 1000 g/mol, less than 800 g/mol, or less than 500 g/mol. The lower limit thereof can be 50 g/mol or 100 g/mol or more. In applying an encapsulating material on a substrate, on which an organic electronic element is formed, the present application implements excellent application properties and processability by comprising the curable monomer. In addition, as the curable monomer is included, the present application can prevent the damage applied to the element by providing the encapsulation composition in a solventless type.

In one example, the curable monomer can have a viscosity in a range of 500 cP or less, or 50 cP to 300 cP, as measured at a temperature of 25° C., a strain of 5% and a frequency of 1 Hz. In applying the encapsulation composition to the periphery of the organic electronic element, the present application can secure processability by comprising the curable monomer having the viscosity range.

The material of the curable monomer is not particularly limited and can include, for example, an epoxy compound, an oxetane compound or an acrylic monomer. The acrylic monomer can include a monofunctional acrylic compound or a multifunctional acrylic compound.

In one example, as the curable monomer, an aromatic or aliphatic; or linear or branched epoxy compound can be used. In one embodiment of the present invention, an epoxy compound having an epoxy equivalent of 50 g/eq to 350 g/eq or 100 g/eq to 300 g/eq, which contains two or more functional groups, can be used. In the present application, as the curable monomer, an epoxy resin having a cyclic structure in its molecular structure can be used, and for example, an alicyclic epoxy resin can be used. The alicyclic epoxy resin can be cured without phase separation by having excellent compatibility with an olefin-based compound or a curable monomer to achieve uniform crosslinking of the composition.

Also, the linear or branched aliphatic epoxy compound can include aliphatic glycidyl ether, 1,4-butanediol diglycidyl ether, ethylene glycol diglycidyl ether, 1,6-hexanediol diglycidyl ether, propyleneglycol diglycidyl ether, diethylene glycol diglycidyl ether, butyl glycidyl ether, 2-ethylhexyl glycidyl ether or neopentyl glycol diglycidyl ether, but is not limited thereto.

Furthermore, as long as the oxetane group compound as the curable monomer has an oxetane functional group, the structure thereof is not limited, which can be exemplified by, for example, OXT-221, CHOX, OX-SC, OXT101, OXT121, OXT221 or OXT212 from TOAGOSEI, or EHO, OXBP, OXTP or OXMA from ETERNACOLL.

In addition, as the curable monomer, the acrylic monomer can include polybutadiene dimethacrylate, 1,4-butanediol di(meth)acrylate, 1,3-butylene glycol di(meth)acrylate, 1,6-hexanediol di(meth)acrylate, 1,8-octanediol di(meth)acrylated, 1,12-dodecanediol di(meth)acrylate, neopentyl glycol di(meth)acrylate, dicyclopentanyl di(meth)acrylate, dicyclopentanyl di(meth)acrylate, cyclohexane-1,4-dimethanol di(meth)acrylate, tricyclodecane dimethanol (meth)acrylate, dimethylol dicyclopentane di(meth)acrylate, neopentyl glycol modified trimethylpropane di(meth)acrylate, adamantane di(meth)acrylate, trimethylol propane tri(meth)acrylate, or a mixture thereof.

In a specific example of the present application, the curable monomer can be included in an amount of 10 to 60 parts by weight, 20 to 55 parts by weight, 30 to 50 parts by weight, or 35 to 48 parts by weight relative to 100 parts by weight of the non-reactive olefin-based compound. Within the above content range, the present application can improve the application properties of the encapsulation composition and implement heat resistance holding power.

In one example, the encapsulation composition can further comprise an inorganic filler. The inorganic filler can be contained separately from a moisture adsorbent, which is described below, for controlling the thixotropic property of the encapsulation composition. The inorganic filler can be distinguished from a moisture adsorbent in that it has no chemical reactivity with moisture. The specific kind of the filler that can be used in the present application is not particularly limited, and for example, one of silica, calcium carbonate, alumina, talc and the like, or a mixture of two or more thereof can be used.

In the present application, in order to improve the bonding efficiency between the filler and the organic binder, a product surface-treated with an organic material can be used as the filler, or a coupling agent can be further added thereto and used.

The encapsulation composition of the present application can comprise 0.1 parts by weight to 300 parts by weight of an inorganic filler relative to 100 parts by weight of the non-reactive olefin-based compound. The lower limit of the content of the inorganic filler is not particularly limited, but can be 1 part by weight, 5 parts by weight, 10 parts by weight, 15 parts by weight, 50 parts by weight, 100 parts by weight, or 150 parts by weight or more. In addition, the upper limit of the content of the inorganic filler can be 300 parts by weight, 280 parts by weight, 200 parts by weight, 180 parts by weight, 130 parts by weight, 90 parts by weight, 80 parts by weight, or 40 parts by weight or less. By controlling the content of the inorganic filler in the above range, the present application can provide an encapsulating material in which the intended encapsulation structure shape in the present application can be easily implemented.

Furthermore, the BET surface area of the inorganic filler can be in a range of 35 to 500 $m^2/g$, 40 to 400 $m^2/g$, 50 to 300 $m^2/g$, or 60 to 200 $m^2/g$. The specific surface area has been measured using the BET method, and specifically, it can be measured by adding, as a sample, 1 g of the inorganic filler to a tube with ASAP2020 (Micromeritics, USA) without pretreatment at −195° C. The average value can be obtained by measuring the same sample three times. In addition, the particle diameter of the inorganic filler can be in the range of 1 to 100 nm or 5 to 50 nm. By using the inorganic filler, the present application can provide an encapsulating material in which the intended encapsulation structure shape in the present application can be easily implemented.

In addition, in a specific example of the present application, the encapsulation composition can comprise a curing agent, if necessary. The curing agent can be a thermal curing agent or a photo-curing agent. For example, a suitable type of curing agent can be selected and used depending on the types of functional groups contained in the non-reactive olefin-based compound, the reactive olefin-based compound or the curable monomer, and one or more curing agents can be used.

In one example, in the case of containing an epoxy group, the curing agent is an epoxy curing agent known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like can be exemplified, but is not limited thereto.

In a specific example of the present application, the curing agent can be a latent thermal curing agent such as an imidazole-isocyanuric acid adduct, an amine-epoxy adduct, a boron trifluoride-amine complex or encapsulated imidazole. That is, in the present invention, light irradiation can proceed first in the curing step of the encapsulation composition to control the initial fluidity, and the curing agent can be completely cured as a latent curing agent in a final curing step after light irradiation.

The content of the curing agent can be selected depending on the composition of the composition, for example, the kind or ratio of the resin. For example, the curing agent can be contained in an amount of 1 part by weight to 100 parts by weight, 1 part by weight to 90 parts by weight or 1 part by weight to 80 parts by weight, relative to 100 parts by weight of the non-reactive olefin-based compound. The weight ratio can be adjusted depending on the kind and ratio of the functional group of the non-reactive olefin-based compound, the acrylic oligomer or the curable monomer, or the crosslinking density to be implemented.

In a specific example of the present application, the encapsulation composition can comprise an initiator. As the initiator, for example, a cationic initiator or a radical initiator can be included.

The cationic initiator can be a cationic photopolymerization initiator, and for example, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

The radical initiator can be a photo-radical initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The content of the photo-radical initiator can be changed depending on the kind and ratio of the functional group in the radical photocurable compound, the crosslinking density to be implemented, and the like. For example, the photo-radical initiator can be compounded in a ratio of 0.1 to 15 parts by weight, 3 parts by weight to 12 parts by weight or 6 parts by weight to 10 parts by weight, relative to 100 parts by weight of the non-reactive olefin-based compound. By comprising the photo-radical initiator in the above content range, the present invention can introduce an appropriate crosslinked structure into the encapsulation composition to implement flow control at high temperature.

In one example, the initiator can comprise a cationic initiator and a radical initiator together, where the cationic initiator can be included in an amount of 0.01 to 10 parts by weight, 0.05 to 5 parts by weight, 0.1 to 4 parts by weight, 0.3 to 2 parts by weight or 0.5 to 1.5 parts by weight, relative to 100 parts by weight of the non-reactive olefin-based compound and the radical initiator can be included in an amount of 3 to 12 parts by weight, 4 to 11 parts by weight, 5 to 10 parts by weight, 6 to 9 parts by weight or 7 to 8 parts by weight, relative to 100 parts by weight of the non-reactive olefin-based compound. In one example, the radical initiator content of the present application can be greater than the cationic initiator content. By controlling the above content range, the present application can implement a proper cross-linked structure in the encapsulation composition to improve heat resistant durability at high temperature and high humidity.

The encapsulation composition of the present application can further comprise a moisture adsorbent. The term "moisture adsorbent" can be used to collectively mean a component capable of adsorbing or removing moisture or moisture introduced from the outside through chemical reaction or the like. That is, it means a moisture-reactive adsorbent, and a mixture thereof is also usable.

The moisture-reactive adsorbent chemically reacts with humidity, moisture or oxygen, and the like introduced into the resin composition or the cured product thereof to adsorb moisture or humidity. The encapsulation composition can further comprise a physical adsorbent, where the physical adsorbent can lengthen the moving path of moisture or humidity penetrating into the resin composition or the cured product thereof to inhibit the penetration and can maximize the barrier property against moisture or humidity through the matrix structure of the resin composition or the cured product thereof and interaction with the moisture-reactive adsorbent or the like.

In the present application, the specific kind of the usable moisture adsorbent is not particularly limited, and for example, in the case of the moisture-reactive adsorbent, it can include one or a mixture of two or more of a metal oxide, a metal salt or phosphorus pentoxide ($P_2O_5$), and the like; and in the case of the physical adsorbent, it can include zeolite, zirconia or montmorillonite, and the like.

Here, a specific example of the metal oxide can include lithium oxide ($Li_2O$), sodium oxide ($Na_2O$), barium oxide (BaO), calcium oxide (CaO) or magnesium oxide (MgO), and the like, and an example of the metal salt can include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as magnesium chloride ($MgCl_2$), strontium chloride ($SrCl_2$), yttrium chloride ($YCl_3$), copper chloride ($CuCl_2$), cesium fluoride ($CsF$), tantalum fluoride ($TaF_5$), lithium bromide ($LiBr$), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto.

In the present application, the moisture adsorbent such as the metal oxide can be compounded in the composition in a properly processed state. For example, a pulverization process of the moisture adsorbent can be required, and a process such as a three-roll mill, a bead mill or a ball mill can be used for pulverizing the moisture adsorbent.

The encapsulation composition of the present application can comprise the moisture adsorbent in an amount of 10 to 150 parts by weight, 35 parts by weight to 120 parts by weight, 40 to 100 parts by weight, 45 parts by weight to 90 parts by weight, 50 to 85 parts by weight, 55 to 80 parts by weight, 60 to 79 parts by weight, or 63 to 77 parts by weight, relative to 100 parts by weight of the non-reactive olefin-based compound. The lower limit of the moisture adsorbent can be, for example, 100 parts by weight or more or 105 parts by weight or more in that a large amount of the moisture adsorbent is included as compared to the conventional one. As the encapsulation composition of the present application preferably controls the content of the moisture adsorbent to 10 parts by weight or more, the encapsulation composition or the cured product thereof can exhibit excellent moisture and humidity barrier properties. In addition, when the content of the moisture adsorbent is controlled to 150 parts by weight or less to form a thin film encapsulation structure, it can exhibit excellent moisture barrier properties.

In one example, the moisture adsorbent can have an average particle diameter in a range of 0.1 to 10 μm, 1 to 8 μm, 1.5 to 5 μm or 1.5 to 3.5 μm. In the present application, the particle diameter can be measured according to D50 particle size analysis, unless otherwise specified. The present application can comprise an excessive amount of the moisture adsorbent in the encapsulation structure while increasing the reactivity with moisture by controlling the particle diameter to improve the moisture barrier performance.

In one example, the encapsulation composition can be in a liquid phase at room temperature, for example, at about 25° C. In a specific example of the present application, the encapsulation composition can be in a solventless type liquid phase. The encapsulation composition can be applied to encapsulating an organic electronic element, and specifically, can be applied to encapsulating sides of an organic electronic element. As the encapsulation composition has a liquid form at room temperature, the present application can encapsulate an organic electronic element by a method of applying the composition to the side of the element.

In a specific example of the present application, a process of applying a liquid composition is performed in sealing sides of an organic electronic element, whereas conventionally, there has been a problem that since the composition has high fluidity after application, it is difficult to maintain the desired encapsulation shape. In one example, the present application performs pre-curing by irradiating the encapsulation composition applied at a desired position with light, so that the final curing can proceed after the fluidity is controlled. Accordingly, the present application can keep the applied encapsulation composition in the desired encapsulated shape until final curing. That is, as the encapsulation composition comprises the above-described specific composition, the present application can introduce a double-curing method, whereby the flow control at high temperature is possible after the encapsulation composition is applied.

The encapsulation composition according to the present application can comprise various additives within the range without affecting the above-mentioned effects of invention, in addition to the above-mentioned configurations. For example, the resin composition can comprise a defoamer, a coupling agent, a tackifier, a ultraviolet stabilizer or an antioxidant, and the like in an appropriate range of content depending on the desired physical properties. In one example, the encapsulation composition can further comprise a defoamer. By comprising the defoamer, the present application can implement defoaming characteristics in the above-described process of applying the encapsulation composition to provide a reliable encapsulation structure. Also, the kind of the defoamer is not particularly limited as long as the physical properties of the encapsulation composition required in the present application are satisfied.

In one example, the encapsulation composition can be a pressure-sensitive adhesive composition or an adhesive composition. Accordingly, the encapsulation composition can also serve as a structural adhesive for attaching the substrate on which the organic electronic element is formed and a cover substrate on the element.

The present application also relates to an organic electronic device. An exemplary organic electronic device can comprise, as shown in FIG. 1, a substrate (21); an organic electronic element (23) formed on the substrate (21); and a side encapsulation layer (10) formed on the periphery of the substrate (21) so as to surround the side surfaces of the organic electronic element (23) and including the above-described encapsulation composition. Furthermore, the exemplary organic electronic device can further comprise a top encapsulation layer (11) covering the top surface of the organic electronic element (23).

The top encapsulation layer and the side encapsulation layer can be present on the same plane. Here, the "same" may mean substantially the same. For example, in the same plane, the substantially the same means that it can have an error within ±5 μm or ±1 μm in the thickness direction. The top encapsulation layer can seal the upper surface of the element, and can seal the side surfaces together as well as the upper surface. The side encapsulation layer can be formed on the side surface of the element, but may not directly contact the side surface of the organic electronic element. For example, the top encapsulation layer can be sealed so as to directly contact with the upper surface and side surfaces of the element. That is, the side encapsulation layer can be located, in the plan view of the organic electronic device, at the periphery of the substrate without contacting the element.

In this specification, the term "periphery" means the edge portion of the perimeter. That is, the periphery of the substrate herein can mean the edge portion of the perimeter in the substrate.

The material constituting the side encapsulation layer is not particularly limited, but can comprise the encapsulation composition as described above.

On the other hand, the top encapsulation layer can comprise an encapsulating resin, where the encapsulating resin can be exemplified by an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin or a mixture thereof, and the like. The components constituting the top encapsulation layer can be the same as or different from those of the encapsulation composition as described above. However, the top encapsulation layer may not contain the above-mentioned moisture adsorbent or may contain a small amount in that the top encapsulation layer is in direct contact with the element. For example, the top encapsulation layer can contain 0 to 20 parts by weight of the moisture adsorbent relative to 100 parts by weight of the encapsulating resin.

In one example, the organic electronic element can comprise a reflective electrode layer formed on a substrate, an organic layer formed on the reflective electrode layer and including at least a light emitting layer, and a transparent electrode layer formed on the organic layer.

In the present application, the organic electronic element (23) can be an organic light emitting diode.

In one example, the organic electronic device according to the present application can be in a top emission type, but is not limited thereto, and can be applied to a bottom emission type.

The organic electronic element can further comprise a protective membrane (passivation membrane) for protecting an electrode between the top encapsulation layer or the side encapsulation layer and the electrode of the element. The protective membrane can be in the form of alternately laminating an organic membrane and an inorganic membrane. In one example, the inorganic membrane can be one or more metal oxides or nitrides selected from the group consisting of Al, Zr, Ti, Hf, Ta, In, Sn, Zn and Si. The inorganic membrane can have a thickness of 0.01 µm to 50 µm or 0.1 µm to 20 µm or 1 µm to 10 µm. In one example, the inorganic membrane of the present application can be an inorganic material that does not include a dopant, or can be an inorganic material containing a dopant. The dopant which can be doped is one or more elements selected from the group consisting of Ga, Si, Ge, Al, Sn, Ge, B, In, Tl, Sc, V, Cr, Mn, Fe, Co and Ni, or an oxide of the element, but is not limited thereto.

The present application also relates to a method for manufacturing an organic electronic device.

In one example, the manufacturing method can comprise a step of applying the above-described encapsulation composition on the periphery of a substrate (21) on which an organic electronic element (23) is formed so as to surround the side surfaces of the organic electronic element (23). The step of applying the encapsulation composition can be a step of forming the side encapsulation layer (10) as described above.

Specifically, the step of forming the side encapsulation layer can comprise a step of applying the above-described encapsulation composition so as to surround the side surfaces of the organic electronic element (23), and can further comprise a step of curing the encapsulation composition. The step of curing the encapsulation composition can comprise a step of irradiating it with light and/or a step of applying light or heat. In one example, the encapsulation composition can be cured through only one step of light irradiation, but is not so limited thereto, and can comprise a pre-curing step and a final curing step. The pre-curing step can comprise irradiating it with light, and the final curing step can comprise irradiating it with light or applying heat.

Here, the substrate (21) on which an organic electronic element (23) is formed can be produced by forming a reflective electrode or a transparent electrode on a substrate (21) such as glass or a film by a method such as vacuum deposition or sputtering, and forming an organic material layer on the reflective electrode. The organic material layer can comprise a hole injecting layer, a hole transporting layer, a light emitting layer, an electron injecting layer and/or an electron transporting layer. Subsequently, a second electrode is further formed on the organic material layer. The second electrode can be a transparent electrode or a reflective electrode. Then, the above-described side encapsulation layer (10) is applied on the periphery of the substrate (21) so as to cover the side of the organic electronic element (23). At this time, the method of forming a side encapsulation layer (10) is not particularly limited, and the above-described encapsulation composition can be applied on the side of the substrate (21) using a process such as screen printing or dispenser applying. Furthermore, a top encapsulation layer (11) for encapsulating the top of the organic electronic element (23) can be applied. As the method of forming a top encapsulation layer (11), a known method in the art can be applied, and for example, a liquid drop injection (one drop fill) process can be used.

In addition, in the present invention, a curing process can also be performed on the top or side encapsulation layer for encapsulating the organic electronic element, where this curing process (final curing) can proceed, for example, in a heating chamber or a UV chamber, and preferably in both. The conditions upon the final curing can be appropriately selected in consideration of the stability of the organic electronic device, and the like.

In one example, after the above-described encapsulation composition is applied, the composition can be irradiated with light to induce crosslinking. The light irradiation can comprise irradiating it with light having a wavelength range of the UV-A region band at a light quantity of 0.3 to 6 $J/cm^2$ or a light quantity of 0.5 to 4 $J/cm^2$. As described above, it is possible to implement an encapsulation structure shape that can become a basis by pre-curing it through irradiation of light.

In one example, the manufacturing method can comprise finally curing the encapsulation composition pre-cured after light irradiation. The final curing can further comprise heat-curing it at a temperature of 40° C. to 200° C., 50° C. to 150° C. or 70° C. to 120° C. for 1 hour to 24 hours, 1 hour to 20 hours, 1 hour to 10 hours or 1 hour to 5 hours. Also, the final curing can comprise irradiating it with light having a wavelength range of the UV-A region band at a light quantity of 0.3 to 6 $J/cm^2$ or a light quantity of 0.5 to 4 $J/cm^2$. The final curing of the encapsulation composition can proceed through the step of applying heat or the step of irradiating it with light.

Advantageous Effects

The present application provides an encapsulation composition which can form an encapsulation structure capable of effectively blocking moisture or oxygen introduced from the outside into the organic electronic device, thereby securing the lifespan of the organic electronic device and implementing endurance reliability of the encapsulation structure at high temperature and high humidity, and has high shape retainability, and an organic electronic device comprising the same.

DESCRIPTION OF DRAWINGS

FIG. 1 is a cross-sectional view showing an organic electronic device according to one example of the present invention.

EXPLANATION OF REFERENCE NUMERALS

1: encapsulation composition
10: side encapsulation layer
11: top encapsulation layer
21: substrate
22: cover substrate
23: organic electronic element

DETAILED DESCRIPTION

Hereinafter, the present invention will be described in more detail by way of examples according to the present invention and comparative examples not according to the present invention, but the scope of the present invention is not limited by the following examples.

Hereinafter, the compounds used in Examples and Comparative Examples are as follows.

An acid anhydride-modified polyisobutylene resin (BASF, Glissopal SA, Mw: 1,000 g/mol, hereinafter, PIBSA), polybutene (INEOS, Mw: 2,000 g/mol, H-1900) and Modified-PIB (Mw: 10,000 to 20,000 g/mol), in which in the structure of the following formula 1, R is an acryloyl group, were used as olefin-based compounds.

In addition, hydrogenated epoxy (Kukdo, ST-3000), epoxy acrylate (Sartomer, CN110), and urethane acrylate (Sartomer, CN307) were used as reactive compounds, and an alicyclic epoxy compound (Daicel, Celloxide 2021P, Mw: 250 g/mol, epoxy equivalent 130 g/eq, viscosity 250 cPs, hereinafter, C2021P), 1,6-hexanediol diacrylate (HDDA) and monofunctional acrylate (SR420) were used as curable monomers.

[Formula 1]

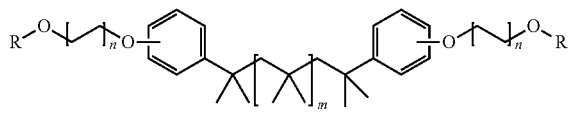

In Formula 1 above, m repeating unit is a polymerization unit derived from an isobutylene monomer, m is any one of 10 to 1000, n repeating unit is a hydrocarbon repeating unit, and n is any one of 10 to 1000.

As the inorganic filler, fumed silica (Aerosil, Evonik, R805, particle size 10 to 20 nm, BET=150 m$^2$/g) was used and as the moisture adsorbent, calcium oxide (CaO, average particle diameter 8 μm, Aldrich) was used.

As the photo-initiator, a photo-cationic initiator (Sanapro, CPI-101A) and a radical initiator (TPO) were used. In addition, a latent thermal curing agent (Adeka, EH-4357S) was used as the thermal curing agent.

Examples 1 to 2 and Comparative Examples 1 to 6

For the above composition, components were compounded in the weight ratios as shown in Table 1 below and introduced into a mixing vessel. The unit is parts by weight. In the mixing vessel, uniform compositions were prepared using a planetary mixer (Kurabo, KK-250s).

TABLE 1

|  | Example | | Comparative Example | | | | | |
|---|---|---|---|---|---|---|---|---|
|  | 1 | 2 | 1 | 2 | 3 | 4 | 5 | 6 |
| PIBSA |  |  | 60 | 65 | 70 |  | 10 |  |
| H-1900 | 55 | 48 |  |  |  |  |  | 65 |
| Modified-PIB | 20 | 31 |  |  |  | 50 | 60 |  |
| ST-3000 |  |  |  |  | 15 |  |  |  |
| CN110 |  |  | 15 |  | 15 | 10 |  |  |
| CN307 |  |  | 15 | 20 |  | 20 |  |  |
| C2021P |  |  | 5 |  |  |  |  |  |
| HDDA | 5 | 3 | 5 | 5 | 5 | 10 | 5 | 25 |
| SR420 | 20 | 18 |  | 10 |  | 10 | 25 | 10 |
| R805 | 10 | 10 | 7 | 10 | 9 | 7 | 7 | 10 |
| CaO | 60 | 60 | 60 | 60 | 60 | 60 | 60 | 60 |
| CPI-101A |  |  | 5 | 2 |  |  | 5 |  |
| TPO | 5 | 5 | 5 | 5 | 5 | 5 | 5 | 5 |
| EH-4357S |  |  |  |  | 10 |  |  |  |

Hereinafter, the physical properties of the encapsulation composition prepared in Examples and Comparative Examples were evaluated in the following manner and the results are shown in Table 2 below.

1. Application Characteristics

The compositions for encapsulation prepared in Examples or Comparative Examples were each set to draw a 150 mm×150 mm square using a coating bar (Musashi 200DS) on a 0.7 T Soda-Lime glass, and then the application characteristics were observed during application (needle number: #18, dispensing speed: 10 mm/sec).

It was classified as O in the case where there was no inflow of air bubbles or clogging during application, Δ in the case where air bubbles were introduced during application or its original shape was lost after application to spread widely, and X in the case where a large amount of air bubbles were introduced during application or the nozzle was clogged and the application was cut off.

2. Heat Resistance and Moisture Resistance

The composition solutions for encapsulation prepared in Examples or Comparative Examples were each applied on a 0.7 T soda-lime glass to a layer of 200 μm using a coating bar. Then, a sample was prepared by laminating it with the same glass, the encapsulation composition was irradiated with light (metal halide lamp) having a wavelength range of the UV-A region band at a light quantity of 3 J/cm$^2$ and then, in Comparative Example 3, heat was additionally applied thereto in an oven at 100° C. for 3 hours. Then, the sample was held in a constant temperature and humidity chamber at 85° C. and 85% relative humidity for about 1000 hours.

The measurement of heat resistance was indicated as 0 in the case where there was no change in the inside and the side of the coating region, A in the case where 2 or less voids occurred inside the coating region, and X in the case where a large number of voids, such as 3 or more voids, occurred inside the coating region.

The measurement of moisture resistance was indicated as 0 in the case where there was no lifting of the region penetrated with moisture, A in the case where the lifting partly occurred, and X in the case where the moisture penetration site was greatly lifted from the glass.

3. Moisture Barrier Property

Calcium was deposited to a size of 5 mm×5 mm and a thickness of 100 nm on a glass substrate having a size of 100 mm×100 mm and the compositions for encapsulation of Examples and Comparative Examples were each applied to the edge part excluding the calcium so that a 3 mm bezel was formed. After it was laminated with a cover glass having a size of 100 mm×100 mm in the coated state, UV irradiation was performed at a light quantity of 3 J/cm² using a metal halide light source, and then heat was applied thereto in an oven at 100° C. for 1 hour. The obtained specimens are observed in a constant temperature and humidity chamber at 85° C. and 85% relative humidity to observe the time when calcium begins to become transparent by oxidation reaction due to moisture penetration.

TABLE 2

|  |  | Application Characteristics | Heat Resistance/ Moisture Resistance | Moisture Barrier Property (hour) |
|---|---|---|---|---|
| Example | 1 | ○ | ○/○ | 1400 |
|  | 2 | ○ | ○/○ | 1700 |
| Comparative | 1 | ○ | ○/X | 700 |
| Example | 2 | ○ | ○/X | 900 |
|  | 3 | ○ | X/X | Not measurable |
|  | 4 | ○ | X/X | Not measurable |
|  | 5 | X | X/X | Not measurable |
|  | 6 | ○ | ○/X | Not measurable |

The invention claimed is:

1. An encapsulation composition comprising:
a non-reactive olefin-based compound; and
a reactive olefin-based compound included in a range of 10 to 150 parts by weight relative to 100 parts by weight of the non-reactive olefin-based compound,
wherein the reactive olefin-based compound has an active energy ray-curable functional group, and
wherein the active energy ray-curable functional group includes a vinyl group, an acryloyl group or a methacryloyl group.

2. The encapsulation composition according to claim 1, wherein the non-reactive olefin-based compound has a weight average molecular weight in a range of 500 g/mol to 100,000 g/mol.

3. The encapsulation composition according to claim 1, wherein the non-reactive olefin-based compound is included in a range of 40 to 90 wt % in the encapsulation composition.

4. The encapsulation composition according to claim 1, wherein the reactive olefin-based compound has a weight average molecular weight in a range of 1,000 g/mol to 50,000 g/mol.

5. The encapsulation composition according to claim 1, wherein the reactive olefin-based compound has one or more reactive functional groups at the end of the reactive olefin-based compound.

6. The encapsulation composition according to claim 1, wherein the active energy ray-curable functional group is a radical-curable functional group.

7. The encapsulation composition according to claim 1, wherein the non-reactive olefin-based compound or the reactive olefin-based compound comprises an isobutylene monomer as a polymerization unit.

8. The encapsulation composition according to claim 1, wherein the reactive olefin-based compound is included in a range of 50 wt % or less in the encapsulation composition.

9. The encapsulation composition according to claim 1, wherein the reactive olefin-based compound is included in a range of 25 to 90 parts by weight relative to 100 parts by weight of the non-reactive olefin-based compound.

10. The encapsulation composition according to claim 1, further comprising a curable monomer.

11. The encapsulation composition according to claim 10, wherein the curable monomer has a weight average molecular weight of 50 g/mol or more and less than 1,000 g/mol.

12. The encapsulation composition according to claim 10, wherein the curable monomer comprises an epoxy compound, an oxetane compound or an acrylate monomer.

13. The encapsulation composition according to claim 10, wherein the curable monomer is included in an amount of 10 to 60 parts by weight relative to 100 parts by weight of the non-reactive olefin-based compound.

14. The encapsulation composition according to claim 1, further comprising an inorganic filler.

15. The encapsulation composition according to claim 14, wherein the inorganic filler is included in an amount of 0.1 parts by weight to 300 parts by weight relative to 100 parts by weight of the non-reactive olefin-based compound.

16. The encapsulation composition according to claim 1, further comprising a cationic initiator or a radical initiator.

17. The encapsulation composition according to claim 1, further comprising a moisture adsorbent.

18. An organic electronic device comprising:
a substrate;
an organic electronic element formed on the substrate; and
a side encapsulation layer formed on the periphery of the substrate so as to surround the side surfaces of the organic electronic element and containing the encapsulation composition according to claim 1.

19. A method for manufacturing an organic electronic device, comprising steps of:
applying the encapsulation composition of claim 1 on the periphery of a substrate, on which an organic electronic element is formed, so as to surround the side surfaces of the organic electronic element, and
curing the encapsulation composition.

* * * * *